(12) United States Patent
Abboud et al.

(10) Patent No.: US 7,535,238 B2
(45) Date of Patent: May 19, 2009

(54) IN-LINE ELECTRON BEAM TEST SYSTEM

(75) Inventors: Fayez E. Abboud, Pleasanton, CA (US); Sriram Krishnaswami, Saratoga, CA (US); Benjamin M. Johnston, Los Gatos, CA (US); Hung T. Nguyen, Fremont, CA (US); Matthias Brunner, Kirchheim (DE); Ralf Schmid, Poing (DE); John M. White, Hayward, CA (US); Shinichi Kurita, San Jose, CA (US); James C. Hunter, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/375,625

(22) Filed: Mar. 14, 2006

(65) Prior Publication Data

US 2006/0244467 A1    Nov. 2, 2006

Related U.S. Application Data

(60) Provisional application No. 60/676,558, filed on Apr. 29, 2005.

(51) Int. Cl.
G01R 31/302 (2006.01)
(52) U.S. Cl. ...................... 324/750; 324/751
(58) Field of Classification Search ......... 324/750–765, 324/158.1; 250/310
See application file for complete search history.

(56) References Cited

U.S. PATENT DOCUMENTS

| | | | |
|---|---|---|---|
| 3,983,401 A | 9/1976 | Livesay | |
| 4,090,056 A | 5/1978 | Lockwood et al. | |
| 4,362,945 A | 12/1982 | Rieke | |
| 4,437,044 A | 3/1984 | Veith | |
| 4,471,298 A * | 9/1984 | Frohlich | 324/72.5 |
| 4,495,966 A | 1/1985 | Longamore | |
| 4,528,452 A | 7/1985 | Livesay | |
| 4,532,423 A | 7/1985 | Tojo et al. | |
| 4,684,808 A | 8/1987 | Plies | |
| 4,725,736 A | 2/1988 | Crew | |
| 4,740,705 A | 4/1988 | Crew | |

(Continued)

FOREIGN PATENT DOCUMENTS

DE    3636316    5/1989

(Continued)

OTHER PUBLICATIONS

Brunner, et al. "Development of Puma 5500/10K Platform," AKT News, vol. 5, Jan. 2001, pp. 13-14.

(Continued)

*Primary Examiner*—Vinh P Nguyen
(74) *Attorney, Agent, or Firm*—Patterson & Sheridan LLP

(57) ABSTRACT

A method and apparatus for testing a plurality of electronic devices formed on a large area substrate is described. In one embodiment, the apparatus performs a test on the substrate in one linear axis in at least one chamber that is slightly wider than a dimension of the substrate to be tested. Clean room space and process time is minimized due to the smaller dimensions and volume of the system.

25 Claims, 8 Drawing Sheets

U.S. PATENT DOCUMENTS

| | | |
|---|---|---|
| 4,760,567 A | 7/1988 | Crew |
| 4,761,607 A | 8/1988 | Shiragasawa et al. |
| 4,764,818 A | 8/1988 | Crew |
| 4,795,912 A | 1/1989 | Maschke |
| 4,818,933 A | 4/1989 | Kerschner et al. |
| 4,819,038 A | 4/1989 | Alt |
| 4,843,312 A | 6/1989 | Hartman et al. |
| 4,862,075 A | 8/1989 | Choi |
| 4,870,357 A | 9/1989 | Young et al. |
| 4,899,105 A | 2/1990 | Akiyama |
| 4,965,515 A | 10/1990 | Karasawa |
| 4,983,833 A | 1/1991 | Brunner et al. |
| 4,985,676 A | 1/1991 | Karasawa |
| 4,985,681 A | 1/1991 | Brunner et al. |
| 5,081,687 A | 1/1992 | Henley et al. |
| 5,124,635 A | 6/1992 | Henley |
| 5,170,127 A | 12/1992 | Henley |
| 5,175,495 A | 12/1992 | Brahme et al. |
| 5,177,437 A | 1/1993 | Henley |
| 5,258,706 A | 11/1993 | Brunner et al. |
| 5,268,638 A | 12/1993 | Brunner et al. |
| 5,278,494 A | 1/1994 | Obigane |
| 5,285,150 A | 2/1994 | Henley |
| 5,313,156 A | 5/1994 | Klug et al. |
| 5,368,676 A | 11/1994 | Nagaseki et al. |
| 5,369,359 A | 11/1994 | Schmitt |
| 5,371,459 A | 12/1994 | Brunner et al. |
| 5,414,374 A | 5/1995 | Brunner et al. |
| 5,430,292 A | 7/1995 | Honjo et al. |
| 5,432,461 A | 7/1995 | Henley |
| 5,504,438 A | 4/1996 | Henley |
| 5,528,158 A | 6/1996 | Sinsheimer et al. |
| 5,530,370 A | 6/1996 | Larighof et al. |
| 5,558,717 A | 9/1996 | Zhao et al. |
| 5,621,333 A | 4/1997 | Long et al. |
| 5,644,245 A | 7/1997 | Saitoh et al. |
| 5,657,139 A | 8/1997 | Hayashi |
| 5,691,764 A | 11/1997 | Takeoshi et al. |
| 5,742,173 A | 4/1998 | Nakagomi et al. |
| 5,774,100 A | 6/1998 | Aoki et al. |
| 5,801,545 A | 9/1998 | Takeoshi et al. |
| 5,801,764 A * | 9/1998 | Koizumi et al. ............. 348/125 |
| 5,834,007 A | 11/1998 | Kubota |
| 5,834,773 A | 11/1998 | Brunner et al. |
| 5,892,224 A | 4/1999 | Nakasuji |
| 5,923,180 A | 7/1999 | Botka et al. |
| 5,930,607 A | 7/1999 | Satou |
| 5,936,687 A | 8/1999 | Lee |
| 5,973,323 A | 10/1999 | Adler et al. |
| 5,982,190 A * | 11/1999 | Toro-Lira ................... 324/770 |
| 6,033,281 A | 3/2000 | Toro-Lira et al. |
| 6,046,599 A | 4/2000 | Long et al. |
| 6,075,245 A | 6/2000 | Toro-Lira et al. |
| 6,086,362 A | 7/2000 | White et al. |
| 6,137,303 A | 10/2000 | Deckert et al. |
| 6,145,648 A | 11/2000 | Teichman et al. |
| 6,198,299 B1 | 3/2001 | Hollman |
| 6,265,889 B1 | 7/2001 | Tomita et al. |
| 6,281,701 B1 | 8/2001 | Yang et al. |
| 6,288,561 B1 | 9/2001 | Leedy |
| 6,297,656 B1 | 10/2001 | Kobayashi et al. |
| 6,320,568 B1 | 11/2001 | Zavracky |
| 6,337,722 B1 | 1/2002 | Ha |
| 6,337,772 B2 | 1/2002 | Uehara et al. |
| 6,340,963 B1 | 1/2002 | Anno et al. |
| 6,343,369 B1 | 1/2002 | Saunders et al. |
| 6,362,013 B1 | 3/2002 | Yoshimura |
| 6,380,729 B1 | 4/2002 | Smith |
| 6,435,868 B2 | 8/2002 | White et al. |
| 6,450,469 B1 | 9/2002 | Okuna |
| 6,501,289 B1 | 12/2002 | Takeoshi |
| 6,528,767 B2 | 3/2003 | Bagley et al. |
| 6,559,454 B1 | 5/2003 | Murrell et al. |
| 6,566,897 B2 | 5/2003 | Lo et al. |
| 6,570,553 B2 | 5/2003 | Hashimoto et al. |
| 6,730,906 B2 | 5/2004 | Brunner et al. |
| 6,750,455 B2 * | 6/2004 | Lo et al. ..................... 250/346 |
| 6,765,203 B1 | 7/2004 | Abel |
| 6,777,675 B2 | 8/2004 | Parker et al. |
| 6,828,587 B2 | 12/2004 | Yamazaki et al. |
| 6,833,717 B1 * | 12/2004 | Kurita et al. ................ 324/751 |
| 6,873,175 B2 | 3/2005 | Tori-Lira et al. |
| 6,992,290 B2 | 1/2006 | Watanabe et al. |
| 6,995,576 B2 | 2/2006 | Imai |
| 7,005,641 B2 | 2/2006 | Nakasuji et al. |
| 7,075,323 B2 * | 7/2006 | Brunner et al. ............. 324/765 |
| 7,077,019 B2 | 7/2006 | Weiss et al. |
| 7,084,970 B2 | 8/2006 | Weiss et al. |
| 7,088,117 B2 | 8/2006 | Uher et al. |
| 7,137,309 B2 | 11/2006 | Weiss et al. |
| 7,157,921 B2 * | 1/2007 | Shonohara .................. 324/751 |
| 7,180,084 B2 | 2/2007 | Weiss et al. |
| 2001/0052788 A1 | 12/2001 | Tomita |
| 2002/0024023 A1 | 2/2002 | Brunner et al. |
| 2002/0034886 A1 | 3/2002 | Kurita et al. |
| 2002/0047838 A1 | 4/2002 | Aoki et al. |
| 2003/0218456 A1 | 11/2003 | Brunner et al. |
| 2004/0145383 A1 | 7/2004 | Brunner |
| 2005/0040338 A1 | 2/2005 | Weiss et al. |
| 2005/0179451 A1 | 8/2005 | Brunner et al. |
| 2005/0179452 A1 | 8/2005 | Brunner et al. |
| 2006/0038554 A1 | 2/2006 | Kurita et al. |

FOREIGN PATENT DOCUMENTS

| | | |
|---|---|---|
| DE | 19832297 | 9/2001 |
| EP | 0204855 | 12/1986 |
| EP | 0402499 | 9/1991 |
| EP | 0537505 | 11/1993 |
| EP | 0523594 | 12/1993 |
| EP | 0523584 | 6/1994 |
| EP | 0614090 | 9/1994 |
| EP | 0 542 094 B1 | 11/1994 |
| EP | 0762137 | 3/1997 |
| EP | 0806700 | 11/1997 |
| EP | 0 370 276 B1 | 1/1999 |
| EP | 0932 182 A2 | 7/1999 |
| EP | 0999573 | 5/2000 |
| EP | 1045425 | 10/2000 |
| EP | 1045426 | 10/2000 |
| EP | 1233274 | 8/2002 |
| JP | 60-039748 | 3/1985 |
| JP | 63-88741 | 4/1988 |
| JP | 63-88742 | 4/1988 |
| JP | 63-166132 | 7/1988 |
| JP | 63-318054 | 12/1988 |
| JP | 1-307148 | 12/1989 |
| JP | 6-167538 | 6/1994 |
| JP | 7-302563 | 11/1995 |
| JP | 8-173418 | 7/1996 |
| JP | 8-289231 | 11/1996 |
| JP | 1-213944 | 8/1999 |
| JP | 11-264940 | 9/1999 |
| JP | 2000-180392 | 6/2000 |
| JP | 2000-223057 | 8/2000 |
| JP | 2000-268764 | 9/2000 |
| JP | 2001-033408 | 2/2001 |
| JP | 2001-318116 | 11/2001 |
| JP | 2001-358189 | 12/2001 |
| JP | 2002-039976 | 2/2002 |
| JP | 2002-048740 | 2/2002 |
| JP | 2002-257997 | 9/2002 |
| JP | 2002-310959 | 10/2002 |
| JP | 2002-343294 | 11/2002 |

| | | |
|---|---|---|
| JP | 2004-014402 | 1/2004 |
| TW | 344876 | 11/1998 |
| TW | 427551 | 3/2001 |
| TW | 459140 | 10/2001 |
| TW | 473772 | 1/2002 |
| TW | 511207 | 11/2002 |
| TW | 512428 | 12/2002 |
| TW | 536630 | 6/2003 |
| TW | 2003-01535 | 7/2003 |
| TW | 541430 | 7/2003 |
| WO | WO 92-09900 | 6/1992 |
| WO | WO 98-31050 | 7/1998 |
| WO | WO 99-23684 | 5/1999 |
| WO | WO 99-60614 | 11/1999 |
| WO | WO 02-33745 | 4/2002 |
| WO | WO 02-45137 | 6/2002 |

OTHER PUBLICATIONS

Brunner, M., "TFT Array Testing: Replacing Mechanics by Electron Beam Deflection," AKT News, vol. 6, Apr. 2001, pp. 15-17.

Invitation to pay additional fees dated Oct. 21, 2003 for PCT/US03/15903.
European Search Report for EP 03 026 267.9, dated Apr. 5, 2004.
Invitation to pay additional fees dated May 11, 2005 for PCT/US04/043202.
PCT Search Report and Written Opinion for PCT/US2004/043202, dated Jul. 28, 2005.
TIPO Official Action for patent application No. 94123638, dated Dec. 25, 2006.
German Search Report, dated Jul. 18, 2003, for DE 10253717.8.
German Examination Report, dated Jul. 14, 2003 for DE 10253717.8.
PCT English Translation of International Preliminary Exam for PCT/EP03/06481, dated Mar. 10, 2005.
Kumada, et al, "Non-Contact Array Testers" LCD Panel Process Inspection Technology (No. 10).
PCT International Search Report for PCT/US03/15903, dated Jan. 16, 2004.
PCT Search Report and Written Opinion for PCT/US2005/26866, dated Aug. 30, 2006.

* cited by examiner

IN-LINE ELECTRON BEAM TEST SYSTEM

CROSS-REFERENCE TO RELATED APPLICATIONS

This application claims benefit of U.S. Provisional Patent Application No. 60/676,558, filed Apr. 29, 2005, which is incorporated herein by reference.

BACKGROUND OF THE INVENTION

1. Field of the Invention

Embodiments of the present invention generally relate to a test system for substrates. More particularly, the invention relates to an integrated testing system for large area substrates in the production of flat panel displays.

2. Description of the Related Art

Flat panel displays, sometimes referred to as active matrix liquid crystal displays (LCD's), have recently become commonplace in the world as a replacement for the cathode ray tubes of the past. The LCD has several advantages over the CRT, including higher picture quality, lighter weight, lower voltage requirements, and low power consumption. The displays have many applications in computer monitors, cell phones and televisions to name but a few.

One type of active matrix LCD includes a liquid crystal material sandwiched between a thin film transistor (TFT) array substrate and a color filter substrate to form a flat panel substrate. The TFT substrate includes an array of thin film transistors, each coupled to a pixel electrode and the color filter substrate includes different color filter portions and a common electrode. When a certain voltage is applied to a pixel electrode, an electric field is created between the pixel electrode and the common electrode, orienting the liquid crystal material to allow light to pass therethrough for that particular pixel.

A part of the manufacturing process requires testing of the flat panel substrate to determine the operability of pixels. Voltage imaging, charge sensing, and electron beam testing are some processes used to monitor and troubleshoot defects during the manufacturing process. In a typical electron beam testing process, TFT response within the pixels is monitored to provide defect information. In one example of electron beam testing, certain voltages are applied to the TFT's, and an electron beam may be directed to the individual pixel electrodes under investigation. Secondary electrons emitted from the pixel electrode area are sensed to determine the TFT voltages.

The size of the processing equipment as well as the process throughput time is a great concern to flat panel display manufacturers, both from a financial standpoint and a design standpoint. Current flat panel display processing equipment generally accommodates large area substrates up to about 2200 mm by 2500 mm and larger. The demand for larger displays, increased production and lower manufacturing costs has created a need for new testing systems that can accommodate larger substrate sizes and minimize clean room space.

Therefore, there is a need for a test system to perform testing on large area substrates that minimizes clean room space and reduces testing time.

SUMMARY OF THE INVENTION

The present invention generally provides a method and apparatus for testing electronic devices on a substrate that performs a testing sequence by moving the substrate under a beam of electrons from a plurality of electron beam columns. The plurality of electron beam columns form a collective test area adapted to test the entire width or length of the substrate. The substrate is moved relative the test area in one direction until the entire substrate has been subjected to the beam of electrons. A testing chamber is disclosed that may be coupled to one or more load lock chambers, or the testing chamber may also function as a load lock chamber.

In one embodiment, an apparatus for testing electronic devices on a large area substrate is described. The apparatus includes a movable substrate support, and at least one testing column above the substrate support, wherein the substrate support is movable in a single axis, the single axis orthogonal to an optical axis of the at least one testing column.

In another embodiment, an apparatus for testing electronic devices located on a large area substrate is described. The apparatus includes a testing platform having a support surface for supporting the large area substrate, and a plurality of testing columns coupled to the testing platform, each of the plurality of testing columns having an optical axis within a test area, wherein the testing platform is movable in a linear direction relative to the optical axis and the plurality of testing columns have a collective test area sufficient to test a width or a length of the substrate as the substrate is moved through the system.

In another embodiment, a system for testing electronic devices located on a large area substrate is described. The system includes a chamber, a substrate support within the chamber, the substrate support sized to receive the substrate, and a plurality of testing devices coupled to an upper surface of the chamber, each of the plurality of testing devices having a test area, wherein the plurality of testing devices are spaced to form a collective test area sufficient to test a length or a width of the substrate as the substrate is moved through the system.

In another embodiment, a method for testing a plurality of electronic devices on a large area substrate is described. The method includes providing a substrate support disposed below a plurality of testing devices, positioning the substrate having the plurality of electronic devices located thereon on the substrate support, providing a test area on the substrate from the plurality of testing columns, and moving the substrate support in a single directional axis relative to the plurality of testing columns.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The term substrate as used herein refers generally to large area substrates made of glass, a polymeric material, or other substrate materials suitable for having an electronic device formed thereon. Embodiments depicted in this application will refer to various drives, motors and actuators that may be one or a combination of the following: a pneumatic cylinder, a hydraulic cylinder, a magnetic drive, a stepper or servo motor, a screw type actuator, or other type of motion device that provides vertical movement, horizontal movement, combinations thereof, or other device suitable for providing at least a portion of the described motion.

Various components described herein may be capable of independent movement in horizontal and vertical planes. Vertical is defined as movement orthogonal to a horizontal plane and will be referred to as the Z direction. Horizontal is defined as movement orthogonal to a vertical plane and will be referred to as the X or Y direction, the X direction being movement orthogonal to the Y direction, and vice-versa. The X, Y, and Z directions will be further defined with directional insets included as needed in the Figures to aid the reader.

Figure 1:
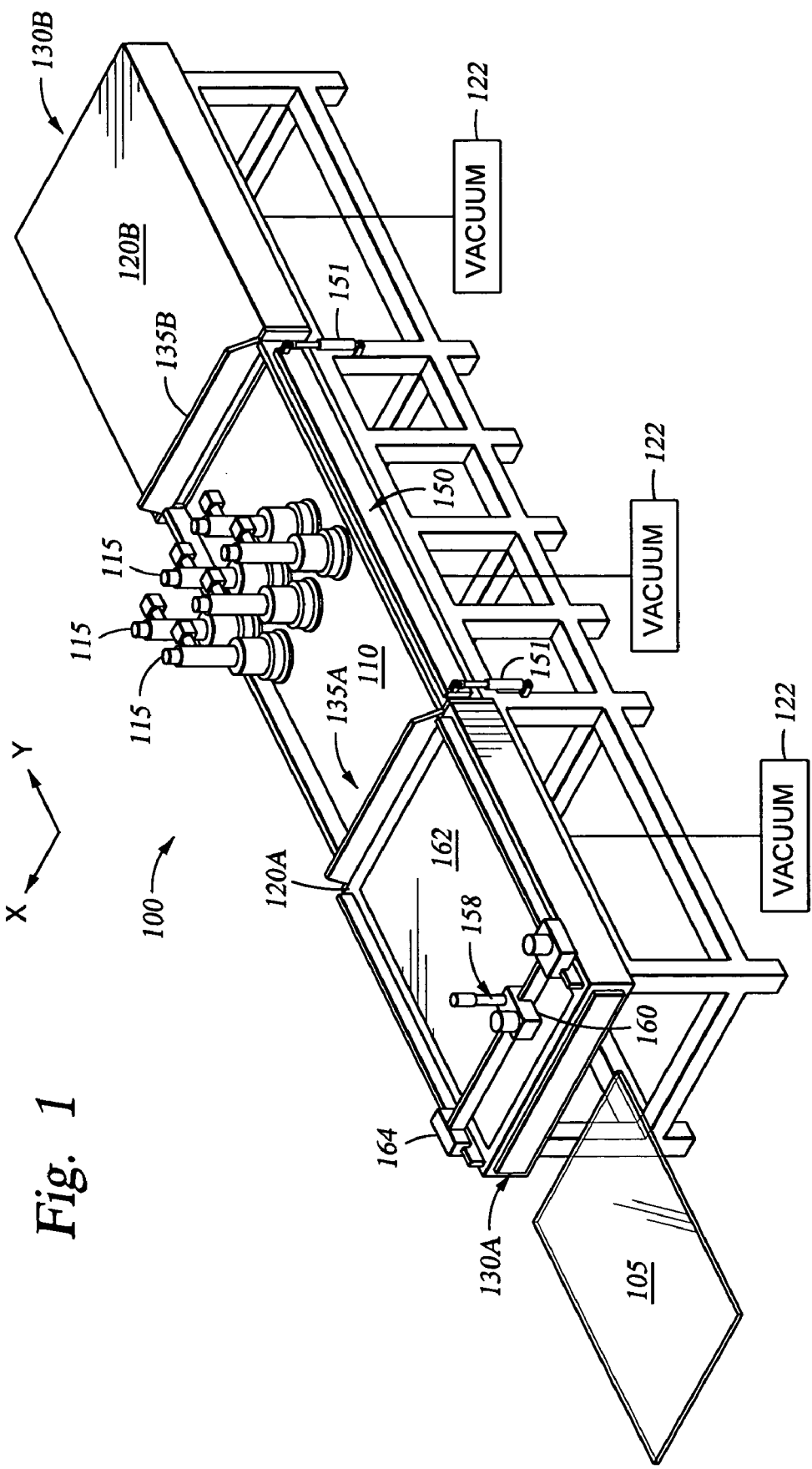
FIG. 1 is one embodiment of a test system.

FIG. 1 is an isometric view of one embodiment of an in-line test system 100 adapted to test the operability of electronic devices located on large area flat panel substrates, for example, the large area substrates having dimensions up to and exceeding about 2200 mm by about 2600 mm. The test system 100 includes a testing chamber 110, one or more load lock chambers 120A, 120B, and a plurality of testing columns 115 (six are shown in FIG. 1), which may be electron beam columns or any device adapted to test electronic devices located on large area substrates, such as thin film transistors (TFT's). The test system 100 is typically located in a clean room environment and may be part of a manufacturing system that includes substrate handling equipment such as robotic equipment or a conveyor system that transports one or more large area substrates to and from the testing system 100.

The one or more load lock chambers 120A may be disposed adjacent and connected to the testing chamber 110 on one side, or on both sides of the testing chamber 110 by a valve 135A disposed between load lock chamber 120A and the testing chamber 110, and a valve 135B disposed between load lock chamber 120B and the testing chamber 110. The load lock chambers 120A, 120B facilitate transfer of large area substrates to and from the testing chamber 110 and ambient environment from a transfer robot and/or a conveyor system typically located in the clean room environment. In one embodiment, the one or more load lock chambers 120A, 120B may be a dual slot load lock chamber configured to facilitate transfer of at least two large area substrates. Examples of a dual slot load lock chamber is described in U.S. Pat. No. 6,833,717, which issued Dec. 21, 2004, and U.S. patent application Ser. No. 11/298,648, filed Jun. 6, 2005, and published as United States Patent Publication No. 2006/0273815 on Dec. 7, 2006, both of which are incorporated herein by reference to the extent the applications are not inconsistent with this disclosure.

In one embodiment, the load lock chamber 120A is adapted to receive the substrate from the clean room environment through an entry port 130A, while the load lock chamber 120B has an exit port 130B that selectively opens to return the large area substrate to the clean room environment. The load lock chambers 120A, 120B are sealable from ambient environment and are typically coupled to one or more vacuum pumps 122, and the testing chamber 110 may be coupled to one or more vacuum pumps 122 that are separate from the vacuum pumps of the load lock chambers 120A, 120B. An example of various components of an electron beam test system for testing large area substrates are described in U.S. Pat. No. 6,833,717, which issued Dec. 21, 2004, previously incorporated by reference.

In one embodiment, the test system 100 includes a microscope 158 coupled to the test system to view any areas of interest encountered on the large area substrate. The microscope 158 is shown attached to a microscope assembly 160 that, in one embodiment, is coupled to the load lock 120A, while alternative embodiments (not shown) may couple the microscope 158 and microscope assembly 160 to one or both of the testing chamber 110 and the load lock chamber 120B. The microscope assembly 160 includes a gantry 164 which facilitates movement of the microscope assembly 160 above a transparent portion 162 on the upper surface of the load lock chamber 120. The transparent portion 162 may be fabricated from a transparent material such as glass, quartz, or other transparent material designed to withstand heat, negative pressure, and other process parameters.

The gantry 164 is configured to provide at least X and Y movement to the microscope assembly 160 to view the areas of interest on the large area substrate disposed in the load lock chamber 120 through the transparent portion 162. For example, the microscope 158 can move in the X and Y directions to a particular coordinate on the large area substrate, and may also move in the Z direction above the large area substrate disposed in the load lock chamber 120. A controller (not shown) may be coupled to the testing system 100 and the microscope assembly 160 to receive input of areas of interest located by the testing columns 115 on the large area substrate and provide coordinates to the microscope assembly 160. In one embodiment (not shown), the microscope assembly may be coupled to the testing chamber 110 adjacent the testing columns 115 and configured to move in at least the X direction parallel to the plurality of testing columns 115. In this embodiment, the testing chamber 110 includes a transparent portion on at least a portion of the upper surface of the testing chamber 110, and the gantry 164 and microscope assembly 160 may be coupled to the upper surface of the testing chamber 110 to view areas of interest on the large area substrate when disposed in the testing chamber 110.

In one embodiment, the test system 100 is configured to transport a large area substrate 105 having electronic devices located thereon through a testing sequence along a single directional axis, shown in the Figure as the Y axis. In other embodiments, the testing sequence may include a combination of movement along the X and Y axis. In other embodiments, the testing sequence may include Z directional movement provided by one or both of the testing columns 115 and a movable substrate support within the testing chamber 110. The substrate 105 may be introduced into the test system 100 along either the substrate width or substrate length. The Y directional movement of the substrate 105 in the test system allows the system dimensions to be slightly larger than the width or length dimensions of the substrate 105.

The test system 100 may also include a movable substrate support table configured to move in at least a Y direction through the test system 100. Alternatively, the substrate 105, with or without a support table, may be transferred through the test system by a conveyor, a belt system, a shuttle system, or other suitable conveyance adapted to transport the substrate 105 through the test system 100. In one embodiment, any of these support and/or transfer mechanisms are configured to only move along one horizontal directional axis. The chamber height of the load locks 120A, 120B, and the testing chamber 110 can be minimized as a result of the unidirectional transport system. The reduced height combined with the minimal width of the testing system provides a smaller volume in the load locks 120A, 120B, and the testing chamber 110. This reduced volume decreases pump-down and vent time in the load lock chambers 120, 125, and the testing chamber 110, thereby enhancing throughput of the test system 100. The movement of the support table along a single directional axis may also eliminate or minimize the drives required to move the support table in the X direction.

Figure 2:
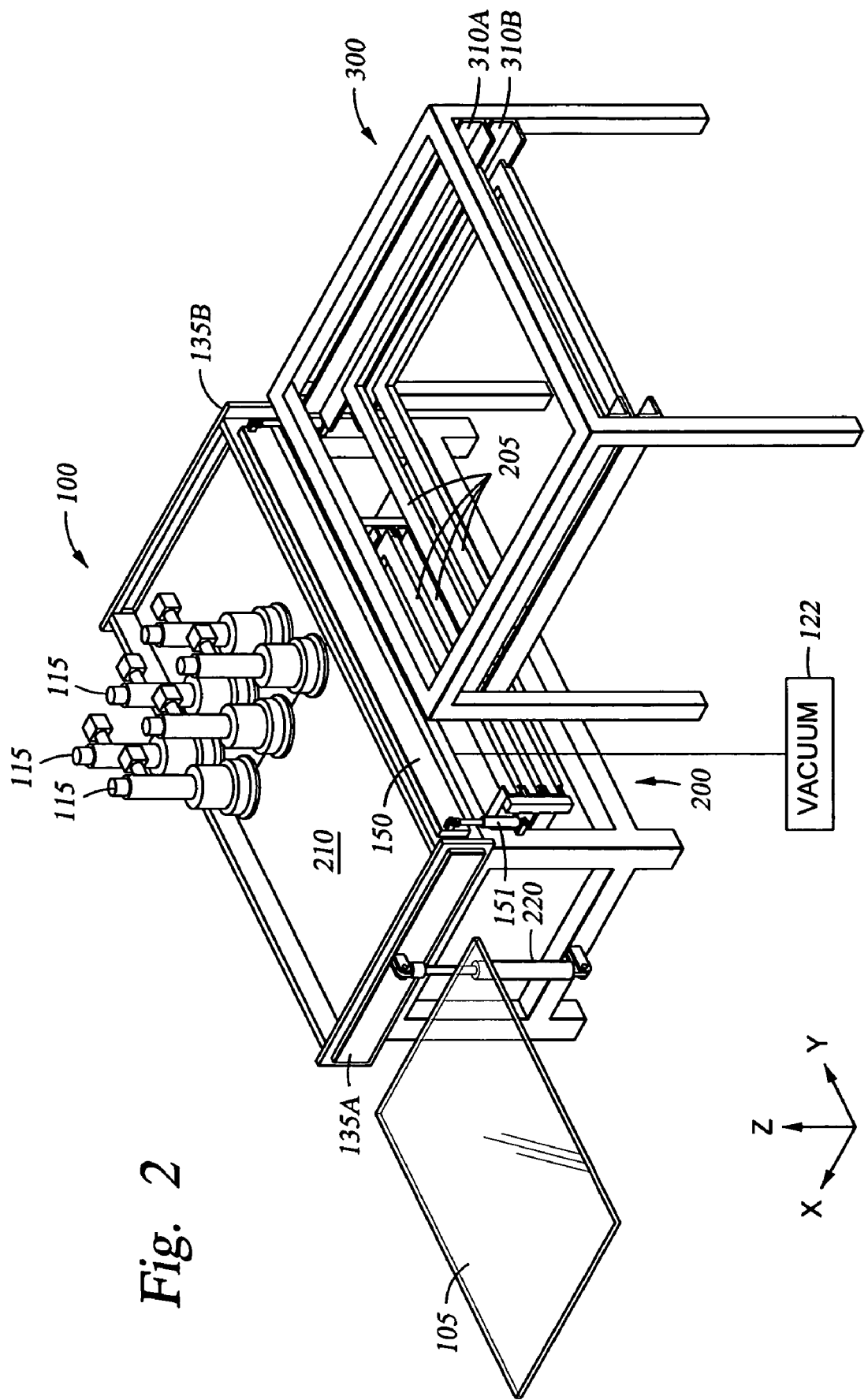
FIG. 2 shows another embodiment of a test system.

FIG. 2 is another embodiment of an electron beam test system 100 having a testing chamber 210 that also functions as a load lock chamber. In this embodiment, the testing chamber 210 is selectively sealed from ambient environment by valves 135A, 135B, and is coupled to a vacuum system 122 designed to provide negative pressure to the interior of the testing chamber 210. Each of the valves 135A, 135B have at least one actuator 220 to open and close the valves when needed. A prober exchanger 300 is positioned adjacent the testing chamber 210 and facilitates transfer of one or more probers 205 into and out of the testing chamber 210. The one or more probers 205 enter and exit the testing chamber 210 through a movable sidewall 150 coupled to the testing chamber 210. The movable sidewall 150 is configured to selectively open and close using one or more actuators 151 coupled to the movable sidewall 150 and a frame portion of the testing chamber 210. In addition to facilitating prober transfer, the movable sidewall 150 also facilitates access and maintenance to the interior of the testing chamber 210.

When the one or more probers 205 are not in use, the one or more probers 205 may be housed in a prober storage area 200 below the testing chamber 210. The prober exchanger 300 includes one or more movable shelves 310A, 310B that facilitate transfer of the one or more probers 205 into and out of the testing chamber 210. In other embodiments, the one or more probers 205 may be stored in other areas adjacent or coupled to the testing chamber 210.

In one embodiment, the movable sidewall 150 is of a length that spans substantially a length of the testing chamber 210. In other embodiments, the movable sidewall 150 is shorter than the length of the testing chamber 210 and is configured to allow sufficient space for one or more load lock chambers coupled to a side or length of the testing chamber 210. In yet another embodiment, the movable sidewall 150 is not used, at least for prober transfer, and the prober transfer is employed through an upper surface of the testing chamber 210.

A detailed description of a prober exchanger and movable sidewall can be found in the description of the Figures in United States Patent Publication No. 2006/0273815, which was previously incorporated by reference. An example of a prober suitable for use in the test system 100 is described in U.S. patent application Ser. No. 10/889,695, filed Jul. 12, 2004 and published as United States Patent Publication No. 2005/0179451 on Aug. 18, 2005, and Ser. No. 10/903,216, which published as United States Patent Publication No. 2005/0179452 on Aug. 18, 2005, which applications are both incorporated herein by reference to the extent the applications are consistent with the disclosure.

Figure 3:
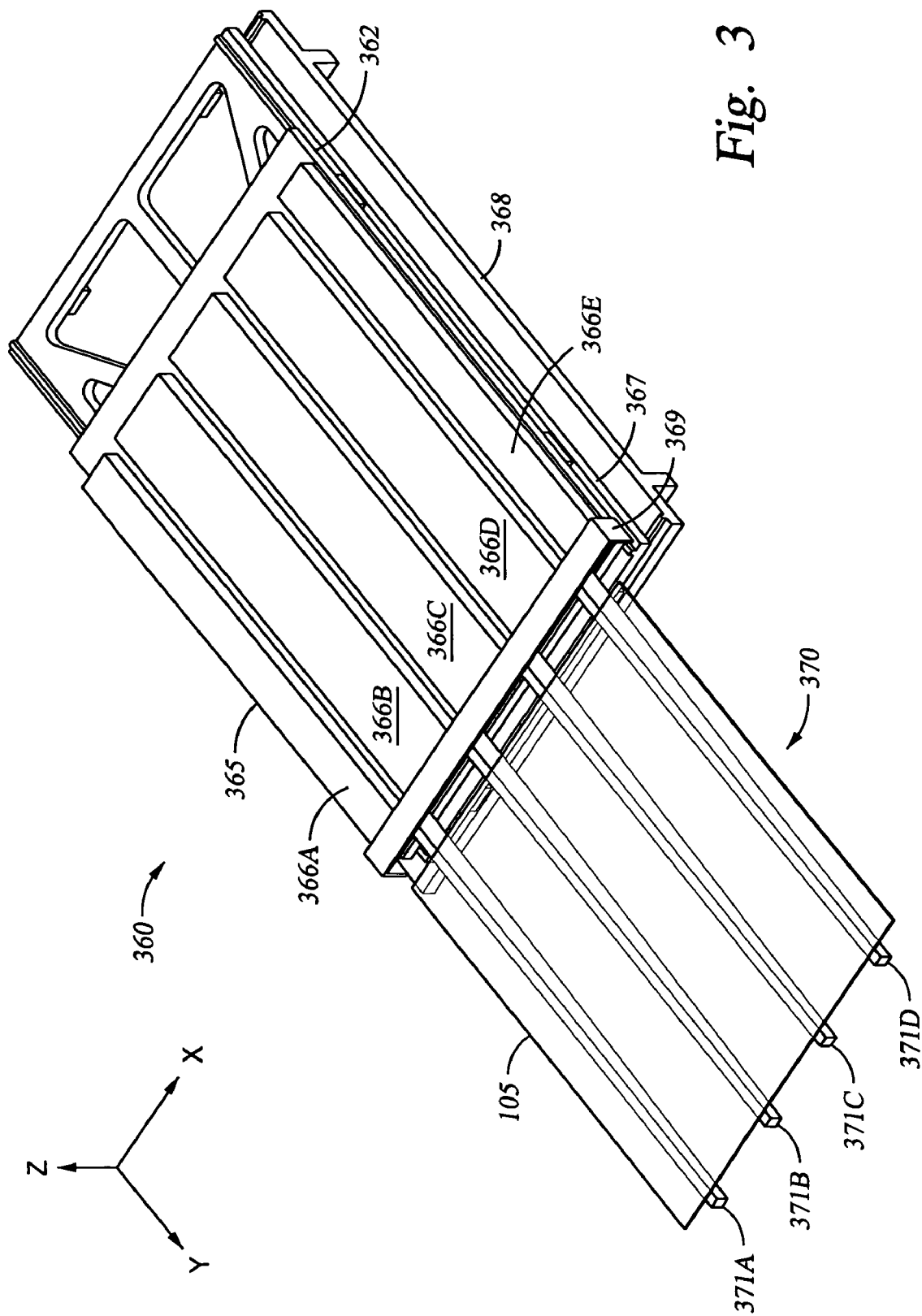
FIG. 3 is a schematic plan view of one embodiment of a substrate support.

FIG. 3 shows a schematic plan view of one embodiment of a substrate support 360 that is configured to be housed within the interior volume of the testing chamber 210, the testing chamber not shown for clarity. In one embodiment, the substrate support 360 is a multi panel stage which includes a first stage, a second stage, and third stage. The three stages are substantially planar plates, and are stacked on one another and, in one aspect, independently move along orthogonal axes or dimensions by appropriate drives and bearings. For simplicity and ease of description, the first stage will be further described below as representing the stage that moves in the X direction and will be referred to as the lower stage 367. The second stage will be further described below as representing the stage that moves in the Y direction and will be referred to as the upper stage 362. The third stage will be further described below as representing the stage that moves in the Z direction and will be referred to as the Z-stage 365.

The substrate support 360 may further include an end effector 370. In one embodiment, the end effector 370 includes a plurality of fingers that rests on an upper surface of the upper stage 362 having a planar or substantially planar upper surface on which the substrate 105 may be supported. In one embodiment, the end effector 370 has two or more fingers connected at least on one end by a support connection 369. The support connection 369 is adapted to couple each of the fingers to allow all of the fingers to move simultaneously. Each finger of the end effector 370 may be separated by a slot or space within the Z stage 365. The actual number of fingers is a matter of design and is well within the skill of one in the art to determine the appropriate number of fingers needed for the size of substrate to be manipulated.

For example, the end effector 370 can have four fingers 371A, 371B, 371C, and 371D that are evenly spaced, which contact and support the substrate 105 when placed thereon. The end effeetor 370 is configured to extend out of the testing chamber to retrieve or deposit the substrate to and from a load lock chamber (FIG. 1), or to and from an atmospheric handling system, such as a transfer robot or conveyor system. The fingers 371A-371D move in and out of the Z-stage 365 such that the fingers 371A-371D interdigitate with the segments 366A, 366B, 366C, 366D, and 366E when the end effeetor 370 is disposed in substantially the same plane as the Z-stage 365. This configuration allows the end effector 370 to freely extend and retract from the substrate support 360 to the load lock chamber or atmospheric handling system. When retracted, the Z-stage 365 is adapted to elevate above the end effector 370 to place the substrate 105 in contact with the planar Z-stage 365. A detailed description of a multi panel stage can be found in the description of the Figures in U.S. Pat. No. 6,833,717 (previously incorporated by reference), and U.S. patent application Ser. No. 11/190,320, filed Jul. 27, 2005 and published as United States Patent Publication No. 2006/0038554 on Feb. 23, 2006, which is incorporated herein by reference to the extent the application is not inconsistent with this disclosure.

Figure 4:
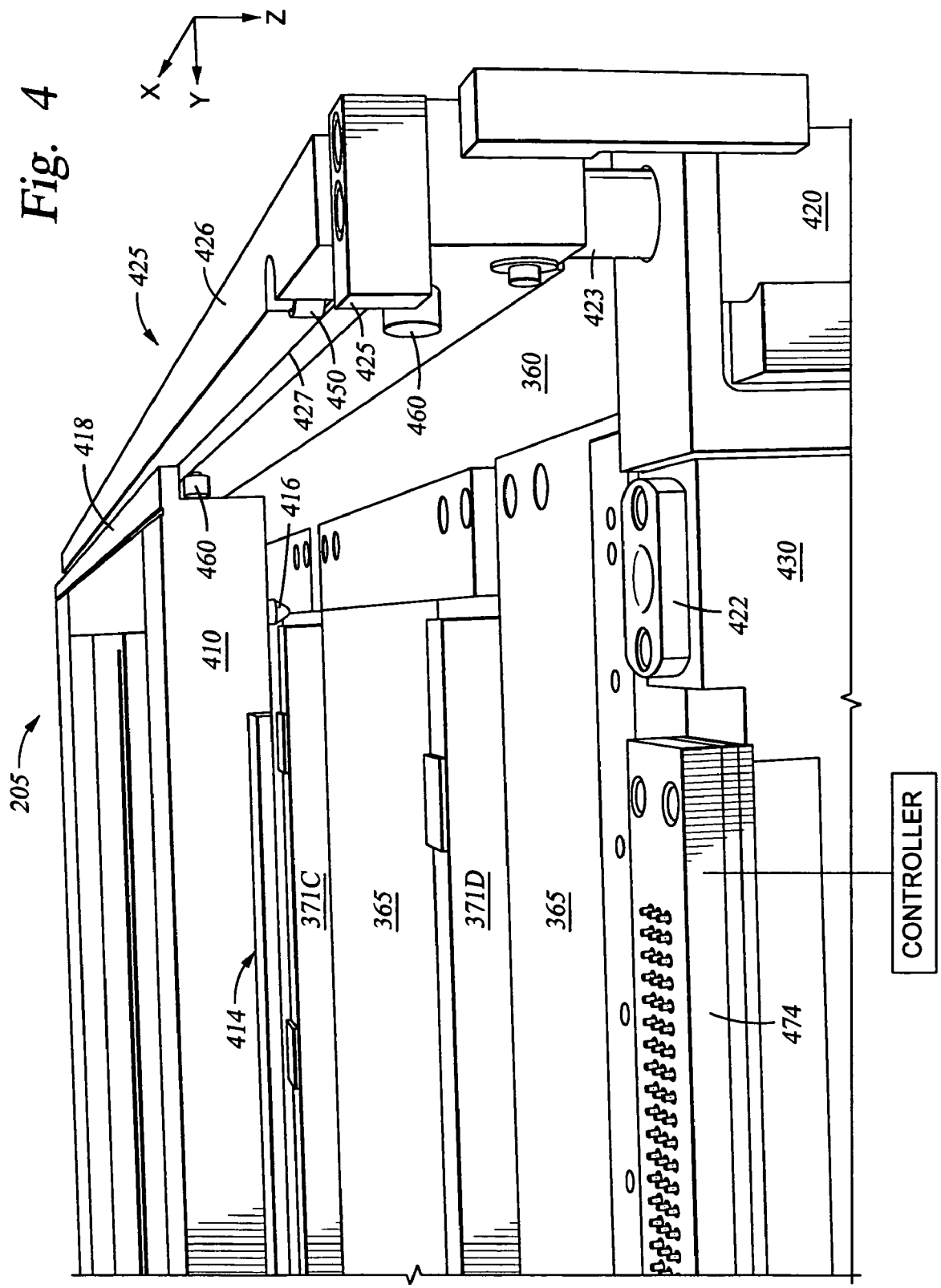
FIG. 4 is a perspective view of another embodiment of a substrate support.

FIG. 4 is a perspective view of a portion of the substrate support 360 configured to be housed within the testing chamber, the testing chamber not shown for clarity. The fingers 371C, 371D of the end effector are shown in a retracted position above the Z stage 365. A prober 205 is shown in a transfer position above the Z stage 365 supported by a prober positioning assembly 425. The prober positioning assembly 425 includes two prober lift members 426 disposed on opposing sides of the substrate support 360 (only one is shown in this view). The prober lift members 426 are coupled to a plurality of Z-motors 420 at each corner of the substrate support 360 (only one is shown in this view). In this embodiment, the Z-drive 420 is coupled to the substrate support 360 adjacent a prober support 430. The prober 205 also has at least one electrical connection block 414 that is in electrical communication with a plurality of prober pins (not shown) that are adapted to contact devices located on the large area substrate. The prober support 430 also provides an interface for the electrical connection block 414 of the prober 205 via a contact block connection 474 that is appropriately connected to a controller.

One side of the prober positioning assembly 425 is shown in FIG. 4 having a plurality of friction reducing members coupled to the prober lift member 426. The friction reducing members are adapted to facilitate transfer of the prober 205 by movably supporting an extended member 418 of the prober frame 410. In this embodiment, the prober lift member 426 includes a channel 427 adapted to receive the extended member 418 of the prober frame 410. The plurality of friction reducing members in this embodiment are upper roller bearings 450 and lower roller bearings 460 coupled to the prober lift member 426 adjacent the channel 427. The lower roller bearings 460 support the extended member 418 and the upper roller bearings 450 act as a guide for the extended member 418 during transfer of the prober frame 410. Also shown is a locating member 416 integral to the prober 205 adapted to seat in a corresponding receptacle 422 integral to the prober support 430 in order to facilitate alignment and support of the prober 205 when positioned on the prober support 430.

In operation, a large area substrate may be supported by the fingers 371C, 371D of the end effector and the Z stage is actuated in a Z direction to place the substrate on an upper surface thereof. The prober 205 is transferred into the testing chamber 110, 210 from the prober exchanger 300 (FIG. 2). The prober 205 is transferred laterally from the prober exchanger 300 onto the prober positioning assembly 425, wherein lateral movement of the prober 205 ceases when the prober frame 410 contacts a stop 425. The Z drive 420, coupled to the prober positioning assembly by a shaft 423, may then be lowered in the Z direction to place the prober pins (not shown) in contact with selected areas or devices located on the large area substrate. Once the prober 205 is in contact with the substrate, the substrate support 360 is free to begin a testing sequence by moving the large area substrate supported thereon under the testing columns 115.

In an exemplary testing operation in reference to FIGS. 1-4, the large area substrate 105 is introduced into the load lock chamber 120A from a substrate handling system that could be a conveyor system or a transfer robot. The load lock chamber 120A is sealed and pumped down to a suitable pressure by the vacuum pump 122. The valve 135A is then opened and the substrate is transferred to the testing chamber 110 by extension and retraction of the end effector 370. With reference to any of the embodiments described herein, the large area substrate may be unloaded from either end of the system. For example, a large area substrate may enter through one end of the system and exit an opposing end, or enter and exit through the same end.

A prober 205, configured to provide or sense a signal to or from the devices located on the large area substrate, may be introduced through a movable sidewall 150 from the prober exchanger 300 adjacent the test system 100. Alternatively, the prober 205 may be transferred to the load lock chamber 120A and coupled to the substrate 105 in the load lock chamber 120A, or coupled to the substrate prior to transfer into the load lock chamber 120A. As another alternative, the testing system 100 may comprise a movable table that includes an integrated prober that is coupled to the substrate throughout the travel path through the test system 100.

Figure 5:
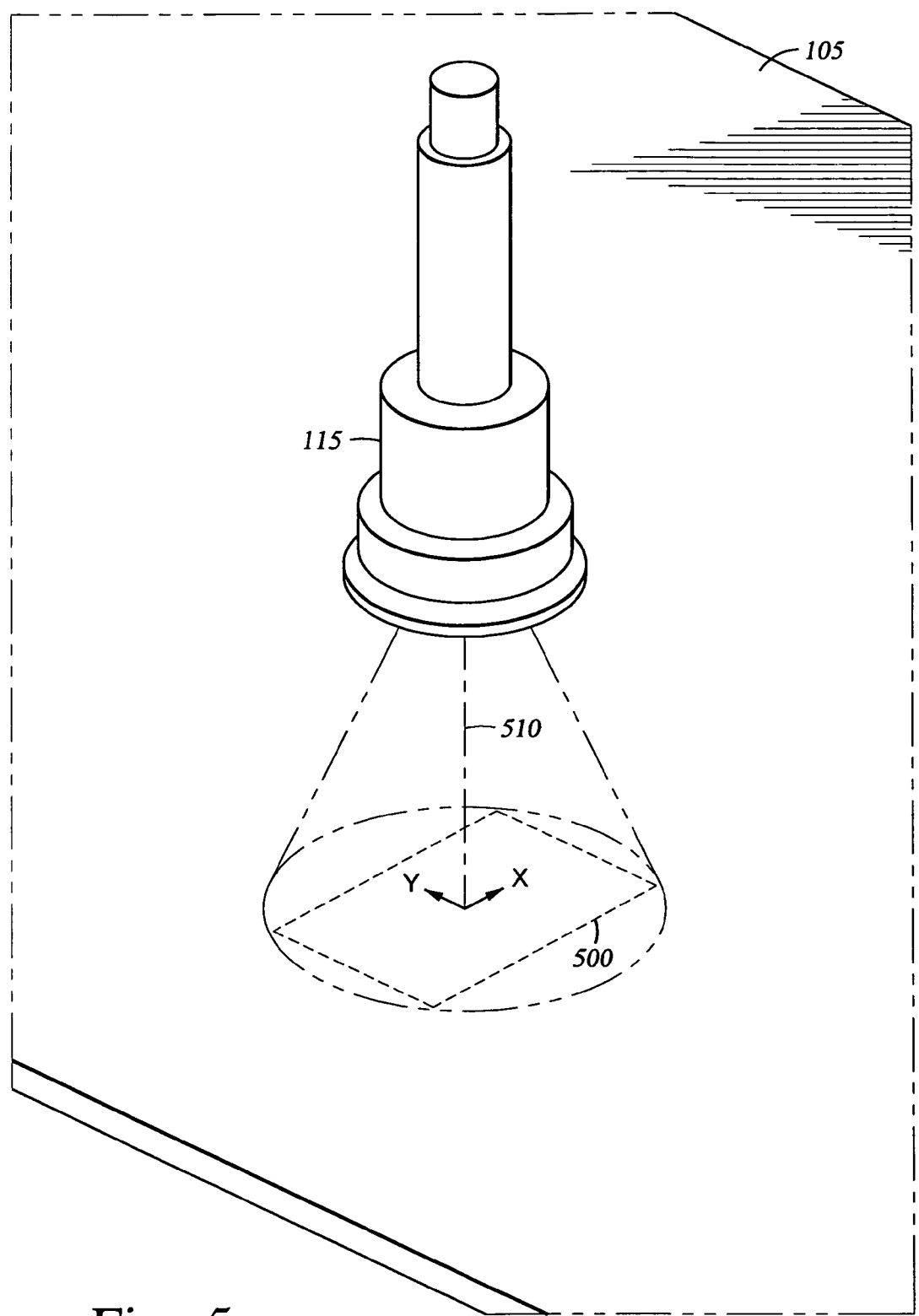
FIG. 5 is one embodiment of a testing column.

FIG. 5 is one embodiment of a testing column 115 that is an electron beam column having an optical axis 510. In one embodiment, the optical axis 510 is the longitudinal axis of each testing column 115 and generally includes a center region of a test area 500 on the substrate 105. Each testing column 115 is configured to produce a test area 500 that may be defined as the address area or addressable quality area of the beam of electrons generated by the electron beam column on the substrate 105. In one embodiment, the test area 500 each electron beam column produces on the substrate 105 is between about 230 mm to about 270 mm in the Y direction and about 340 mm to about 380 in the X direction.

In another embodiment, the test area 500 is between about 240 mm to about 260 mm in the Y direction, for example about 250 mm, and about 350 mm to about 370 mm in the X direction, for example about 360 mm. In this embodiment, adjacent testing columns 115 may have an overlap in test area between about 0.001 mm to about 2 mm, for example about 1 mm, or may have no overlap, wherein the test areas of adjacent beams are adapted to touch with no overlap. In another embodiment, the test area 500 of each testing column is between about 325 mm to about 375 mm in the Y direction and about 240 mm to about 290 mm in the X direction. For example, the test area 500 is about 345 mm in the Y direction, and about 270 mm in the X direction.

In another embodiment, the collective test area is between about 1950 mm to about 2250 mm in the X direction and about 240 mm to about 290 mm in the Y direction. In another embodiment, the collective test area is between about 1920 mm to about 2320 mm in the X direction and about 325 mm to about 375 mm in the Y direction. In one embodiment, adjacent testing columns 115 may have an overlap in test area ranging between about 0.001 mm to about 2 mm, for example about 1 mm. In another embodiment, the test areas of adjacent testing columns 115 may not overlap.

Once the substrate 105 has been introduced into the testing chamber 110 with a prober connected thereto, the testing chamber 110 may be sealed and pumped down. Each of the testing columns 115 are configured to emit a beam of electrons directed toward the substrate. In this configuration, the plurality of testing columns 115 provide a collective test area that is adapted to test the entire width or length of the substrate as the substrate is moved under the testing columns. In one embodiment, a substrate 105 is provided to the test system 100 lengthwise and six testing columns 115 may be used to test the entire width of the substrate as the substrate is moved through the system. In another embodiment, the substrate 105 is provided to the test system 100 widthwise and eight testing columns 115 may be used to test the entire length of the substrate as the substrate is moved through the system. The invention is not limited to the number of testing columns disclosed and the actual number may be more or less depending on substrate size and test area formed on the substrate by the electron beam or beams. The staggered configuration of testing columns 115 shown in FIGS. 1 and 2 produce test areas on the substrate that are adjacent and may partially overlap, at least in the X direction, to allow each pixel on the substrate to be subjected to the beam of electrons during testing in one directional axis.

Figure 6:
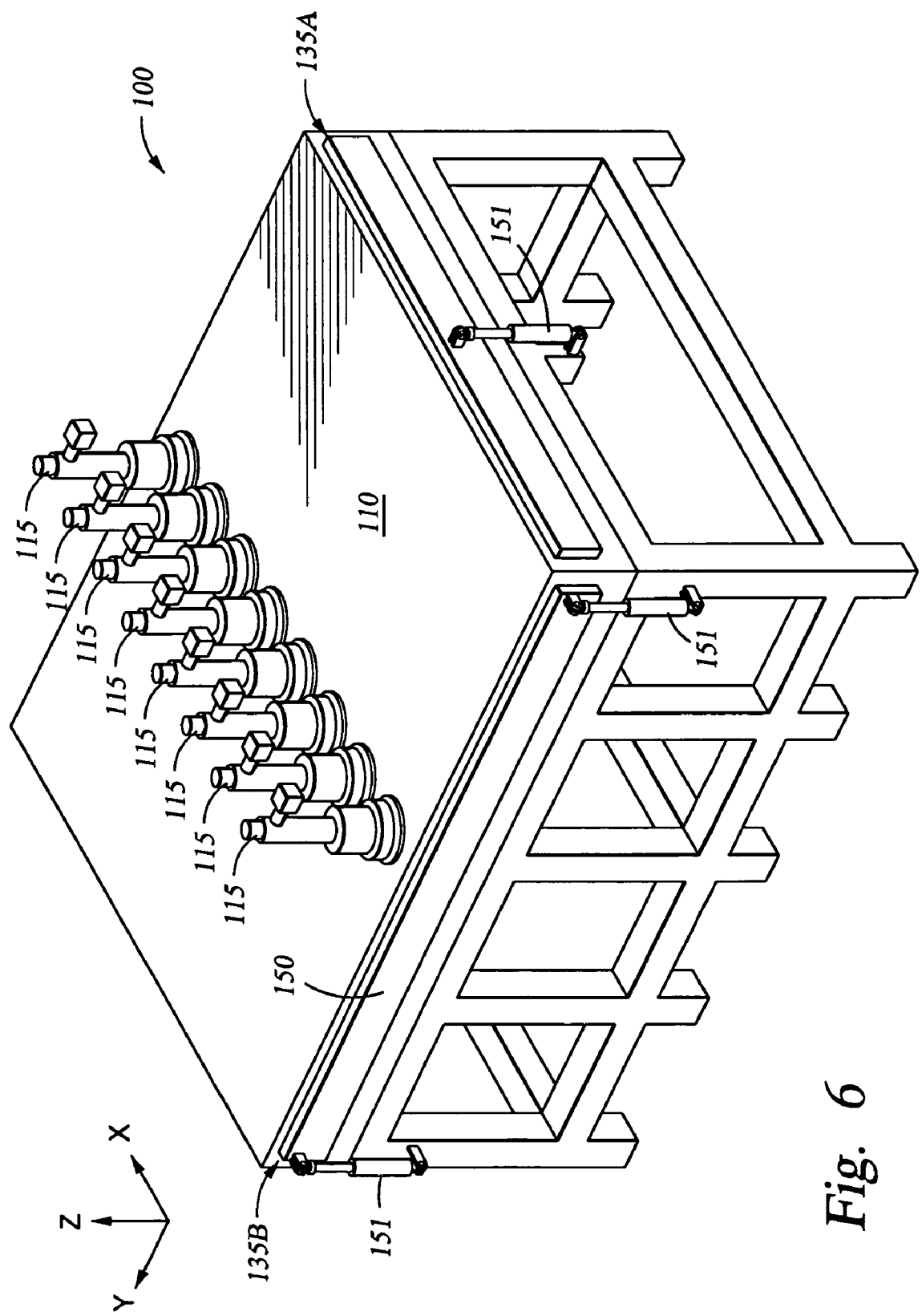
FIG. 6 is another embodiment of a test system.

FIG. 6 is another embodiment of a testing chamber 110 having a plurality of testing columns 115 coupled to the testing chamber 110 in a straight line configuration. This straight line configuration of the plurality of testing columns 115 provides a collective test area sufficient to test a length or width of a large area substrate as the substrate is moved through the system. Although eight testing columns are shown, other embodiments may require more or less, depending on process requirements.

The substrate 105 may be in continuous motion during testing, or the substrate may be moved incrementally during the test sequence. In either case, the entire substrate 105 may be tested in one travel path in the testing chamber 110. Once the testing sequence is complete, the testing chamber 110 may be vented, the prober transferred out of the testing chamber, and the substrate 105 may be transferred to the load lock chamber 120A, 120B, for subsequent return to ambient environment. In the embodiments depicted in FIGS. 2 and 6, the substrate 105 may be returned to ambient environment without transfer to a load lock chamber.

Figure 7:
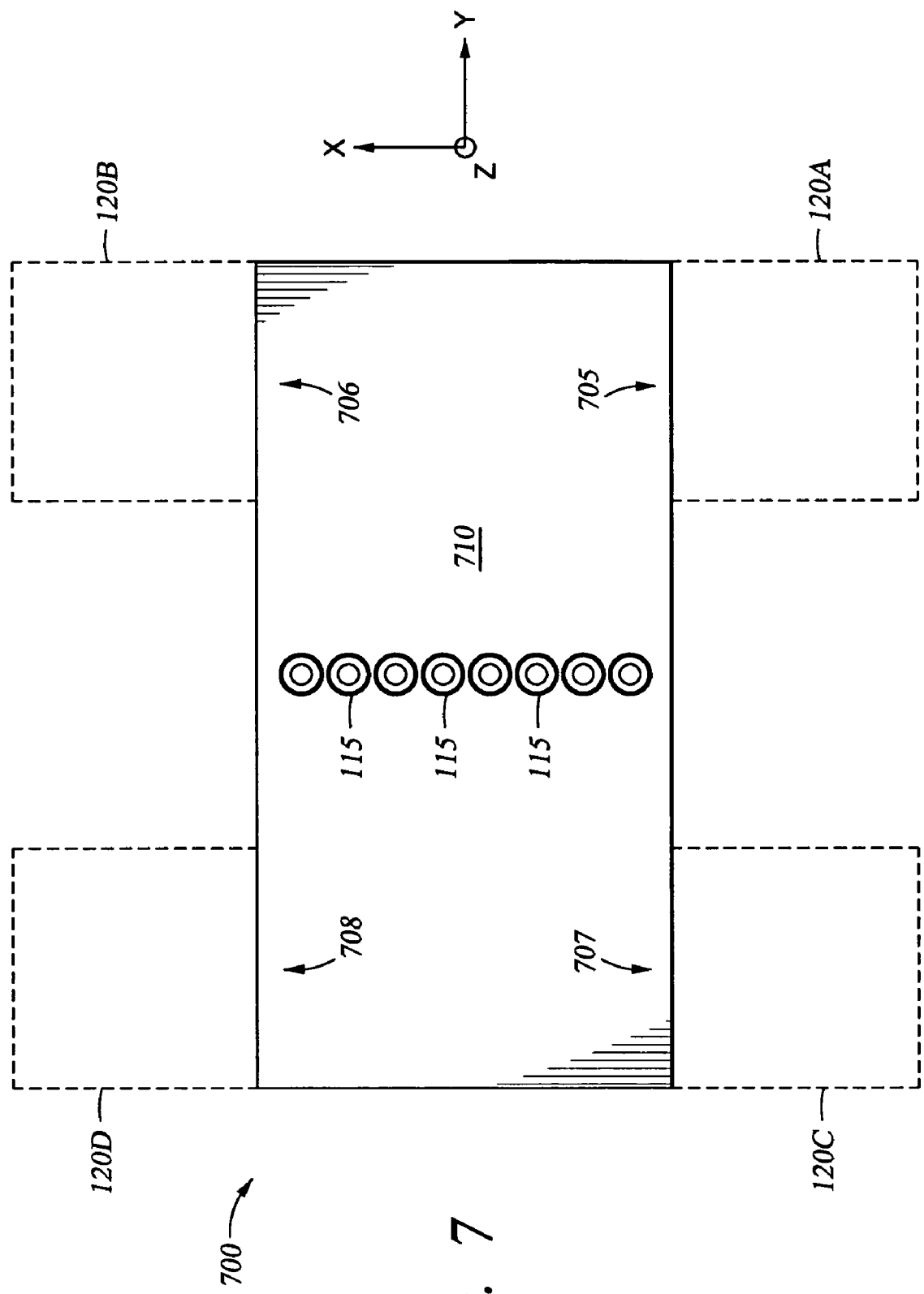
FIG. 7 another embodiment of a test system.

FIG. 7 is another embodiment of a test system 700. The test system comprises a testing chamber 710 having a plurality of testing columns 115 and one or more side portions 705, 706, 707, and 708. The one or more of the side portions 705, 706, 707, and 708 are configured to couple to one or more load lock chambers 120A-120D, which are shown in phantom coupled to the chamber 710 in order to show the adaptability to various substrate travel paths. The various configurations and substrate travel paths using the one or more load lock chambers 120A-120D coupled to the chamber 710 are adaptations to the test system 700 to conserve clean room space and conform to varied clean room work flow paths In one embodiment, the one or more load lock chambers 120A-120D may define a "T" configuration wherein a large area substrate is transferred into and out of the testing chamber 710 through the one or more load lock chambers 120A-120D. For example, the large area substrate may be transferred from the ambient environment of the clean room into the load lock chamber 120A and then transferred back to ambient environment out of the load lock chamber 120B after a testing sequence.

In another embodiment, the one or more load lock chambers 120A-120D may define a "U" configuration wherein a large area substrate is transferred into and out of the one or more load lock chambers 120A-120D. For example, the large area substrate may be transferred from the ambient environment in the clean room into the load lock chamber 120A and then transferred back to ambient environment from the load lock chamber 120C after a testing sequence.

In another embodiment, the one or more load lock chambers 120A-120D may define a "Z" configuration wherein a large area substrate is transferred into and out of the one or more load lock chambers 120A-120D. For example, the large area substrate may be transferred from the ambient environment in the clean room into the load lock chamber 120A and then transferred back to ambient environment from the load lock chamber 120D after a testing sequence.

In the embodiments showing the T, U, and Z configurations of the one or more load lock chambers 120A-120D, the one or more load lock chambers 120A-120D may be a single slot load lock, or a dual slot load lock chamber as described above. The dual slot configuration facilitates transfer of an untested large area substrate to the testing chamber and transfer of a tested large area substrate to ambient environment. The movable sidewall may be adapted to allow space for the one or more load lock chambers coupled to one or more of the side portions 705, 706, 707, and 708. The side portions 705, 706, 707, and 708 may have valves (not shown) between the one or more load lock chambers 120A-120D to facilitate transfer of the large area substrate therebetween. In one embodiment, a prober exchange sequence may be provided by the prober exchanger as described above. In other embodiments, the prober exchange may be provided through an upper portion of the testing chamber, or one or more probers may be coupled to the large area substrate in one or more of the one or more load lock chambers.

Figure 8A:
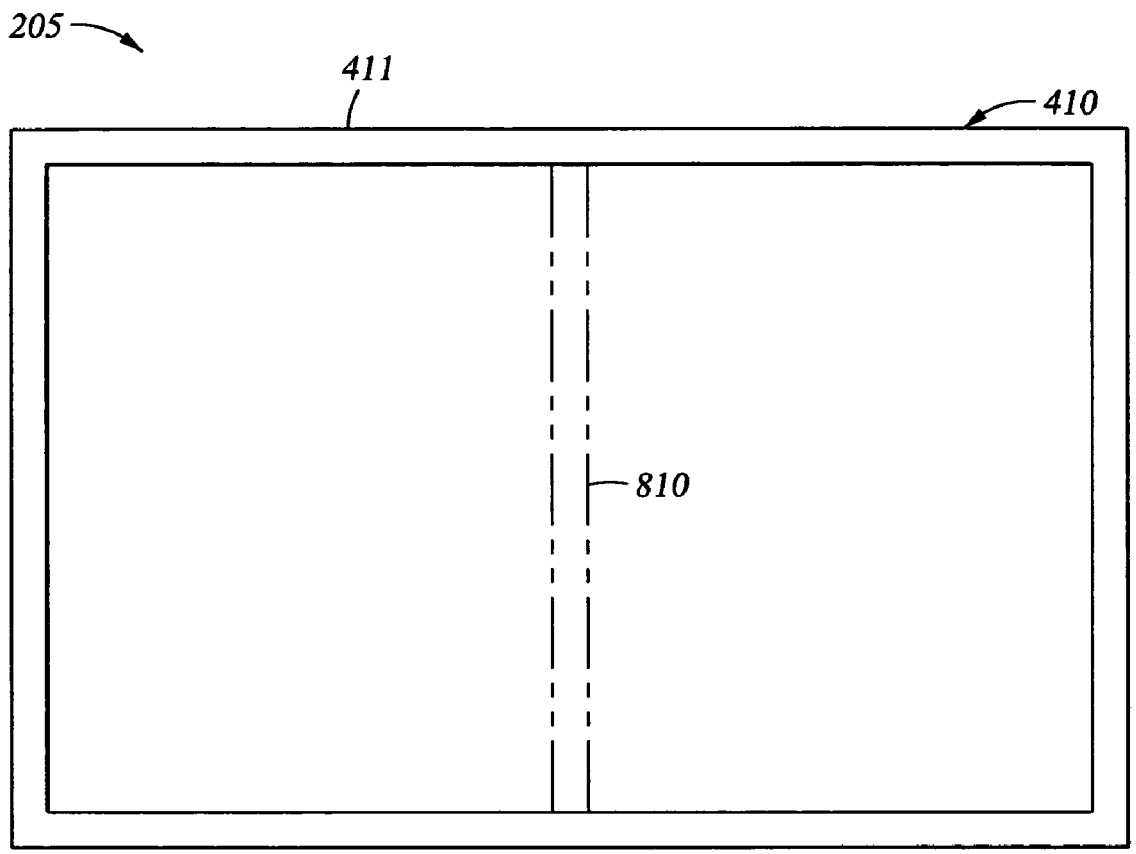
FIG. 8A is one embodiment of a prober.

FIG. 8A is one embodiment of a prober 205 having a rectangular prober frame 410 configured to provide or sense a signal from the devices located on the large area substrate. In one embodiment, the rectangular prober frame 410 is configured to cover a perimeter of the large area substrate having a dimension equal to or greater than the large area substrate and includes a plurality of structural members 411. In this manner, the prober 205 provides a line of sight access or view of at least a center portion of the large area substrate and the electronic devices located thereon. In another embodiment, the prober 205 may include one or more prober bars 810 disposed within, and between parallel portions of, the prober frame 410. The one or more prober bars 810 may be fixed or movable within the prober frame 410. In this embodiment, the one or more prober bars 810 and frame 410 are positioned above the substrate such that minimal or no portions of a primary beam of electrons from the testing columns are covered by the prober frame, and/or minimal or no portions of the secondary electrons are obscured by the prober bars. In this manner, the obscuring of the primary beam or secondary electrons, or the "shading" effect over portions of the large area substrate, is minimized or non-existent.

Figures 8B, 8C:
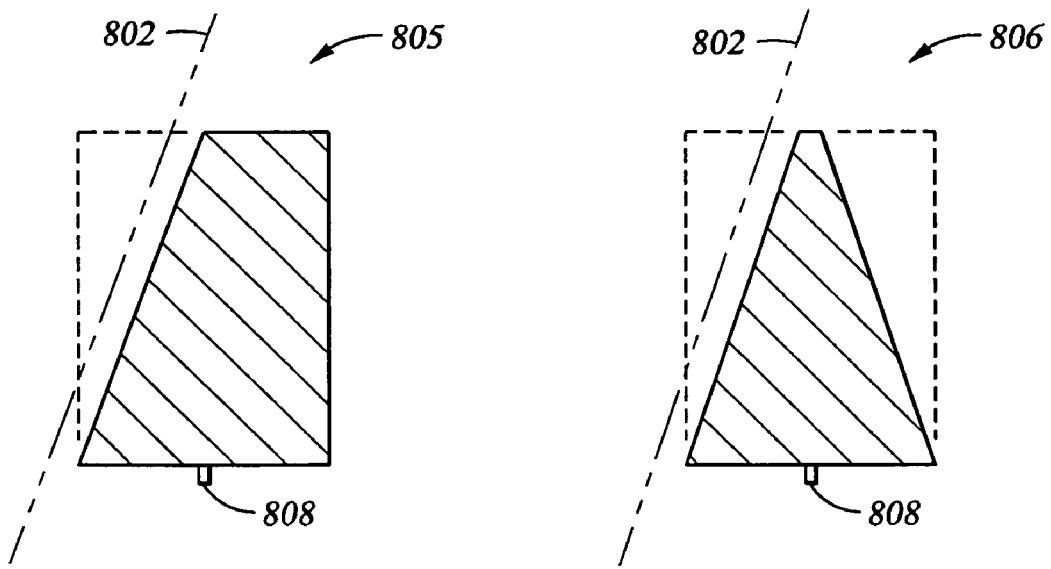
FIG. 8B is a cross-sectional view of one embodiment of a structural member.
FIG. 8C is a cross-sectional view of another embodiment of a structural member.

FIGS. 8B and 8C are cross-sectional views of embodiments of a structural member 805 and 806, respectively. The structural members 805 and 806 are cross-sectional views of the structural members 411 of the prober frame, and/or a cross-sectional view of the one or more prober bars 810. In one embodiment, the structural members 805, 806 have two major sides and at least one minor side, and at least one of the two major sides is slanted. The slanted portion is configured to provide an unobstructed beam path 802, which may be a primary beam path and/or a secondary electron beam path. In other embodiments, the structural members 805, 806 are polygons in a shape to provide rigidity and minimize the shading effect. Examples of structural shapes that provide rigidity and minimize the shading effect are triangles, trapezoids, a trapezoid having one right angle, or combinations thereof.

While the foregoing is directed to embodiments of the present invention, other and further embodiments of the invention may be devised without departing from the basic scope thereof, and the scope thereof is determined by the claims that follow.

The invention claimed is:

1. An apparatus for testing electronic devices on a large area substrate, comprising:
    a movable substrate support having an end effector movably disposed therein; and
    one or more testing columns above the substrate support, each testing column having an optical axis and a test area, wherein the substrate support is movable in a single axis and the single axis is orthogonal to the optical axis of the one or more testing columns, and wherein a collective test area of the testing columns is configured to cover an entire width or an entire length of the substrate such that the testing columns are capable of testing the entire substrate as the substrate support is moved through the apparatus along the single axis.

2. The apparatus of claim 1, wherein the substrate support is housed in a testing chamber and the testing chamber is coupled to a vacuum pump.

3. The apparatus of claim 1, wherein the one or more testing columns comprise an electron beam column.

4. The apparatus of claim 3, wherein the test area of each electron beam column is about 230 mm to about 270 mm in a first direction, and about 340 mm to about 380 mm in a direction orthogonal to the first direction.

5. The apparatus of claim 3, wherein the test area of each electron beam column is about 325 mm to about 375 mm in a first direction, and about 240 mm to about 290 mm in a direction orthogonal to the first direction.

6. The apparatus of claim 1, wherein the one or more testing columns includes six or more testing columns.

7. The apparatus of claim 6, wherein the six or more testing columns are in a substantially straight line above the substrate support.

8. The apparatus of claim 1, wherein the end effector has at least two fingers adapted to support the large area substrate.

9. An apparatus for testing electronic devices located on a large area substrate, comprising:
- a testing platform having a support surface for supporting a large area substrate; and
- a plurality of testing columns coupled to the testing platform, each of the plurality of testing columns having an optical axis within a test area, wherein the testing platform is movable in a linear direction relative to the optical axis and the plurality of testing columns have a collective test area sufficient to test an entire width or an entire length of the substrate such that the testing columns are capable of testing the entire substrate as the substrate is moved in the linear direction through the apparatus.

10. The apparatus of claim 9, wherein the testing platform comprises:
- a substrate support having an end effector.

11. The apparatus of claim 9, wherein the testing platform is within a testing chamber and the testing chamber is coupled to a vacuum pump.

12. A system for testing electronic devices located on a large area substrate, comprising:
- a chamber;
- a substrate support within the chamber, the substrate support sized to receive the substrate; and
- a plurality of electron beam testing devices coupled to an upper surface of the chamber, each of the plurality of testing devices having a test area, wherein the plurality of testing devices are spaced to form a collective test area sufficient to test an entire length or an entire width of the substrate such that the testing devices are capable of testing the entire substrate as the substrate support is moved in a single direction through the system.

13. The system of claim 12, wherein each of the plurality of testing devices has an optical axis and the substrate support is movable in a direction orthogonal to the optical axis.

14. The system of claim 12, wherein the plurality of testing devices include at least six electron beam columns.

15. The system of claim 12, wherein the plurality of testing devices are in a substantially straight line.

16. The system of claim 12, wherein the substrate support comprises:
- an end effector.

17. The system of claim 12, wherein the test area of each of the plurality of testing devices is about 230 mm to about 270 mm in the Y direction, and about 340 mm to about 380 mm in the X direction.

18. The system of claim 12, wherein the test area of each of the plurality of testing devices is about 325 mm to about 375 mm in the Y direction, and about 240 mm to about 290 mm in the X direction.

19. A method for testing a plurality of electronic devices on a large area substrate, comprising:
- providing a substrate support disposed below a plurality of electron beam testing devices;
- positioning the substrate having the plurality of electronic devices located thereon on the substrate support;
- providing a test area on the substrate from the plurality of testing devices; and
- moving the substrate support in a single directional axis relative to the plurality of testing devices, wherein the test area is sufficient to test an entire length or an entire width of the substrate such that the testing devices are capable of testing the entire substrate as the substrate passes through the test area in the single directional axis.

20. The method of claim 19, wherein the test area is between about 1950 mm to about 2250 mm in a first direction and about 240 mm to about 290 mm in a direction orthogonal to the first direction.

21. The method of claim 19, wherein the test area is between about 1920 mm to about 2320 mm in a first direction and about 325 mm to about 375 mm in a direction orthogonal to the first direction.

22. The method of claim 19, wherein the electronic devices are thin film transistors.

23. The method of claim 19, wherein each of the plurality of testing devices are electron beam columns.

24. The method of claim 19, wherein the moving step includes incrementally moving the substrate in the single directional axis.

25. A system for testing electronic devices located on a large area substrate, comprising:
- a movable substrate support having a support surface for supporting the large area substrate; and
- a plurality of electron beam testing columns spanning an entire width of the large area substrate, wherein the large area substrate is movable in a single direction along a length thereof such that the testing columns are capable of testing the entire substrate as the substrate support is moved through the system in the single direction.

* * * * *

UNITED STATES PATENT AND TRADEMARK OFFICE
CERTIFICATE OF CORRECTION

PATENT NO. : 7,535,238 B2  
APPLICATION NO. : 11/375625  
DATED : May 19, 2009  
INVENTOR(S) : Abboud et al.

Page 1 of 1

It is certified that error appears in the above-identified patent and that said Letters Patent is hereby corrected as shown below:

In the Detailed Description:

Column 6, Line 32, please delete "effeetor" and insert --effector-- therefor;

Column 6, Line 38, please delete "effeetor" and insert --effector-- therefor.

Signed and Sealed this

Fourth Day of August, 2009

JOHN DOLL  
*Acting Director of the United States Patent and Trademark Office*